(12) United States Patent
Delabie et al.

(10) Patent No.: US 9,028,623 B2
(45) Date of Patent: May 12, 2015

(54) OXYGEN MONOLAYER ON A SEMICONDUCTOR

(71) Applicant: IMEC, Leuven (BE)

(72) Inventors: Annelies Delabie, Bierbeek (BE); Matty Caymax, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/185,497

(22) Filed: Feb. 20, 2014

(65) Prior Publication Data

US 2014/0239461 A1 Aug. 28, 2014

(30) Foreign Application Priority Data

Feb. 22, 2013 (EP) .................................... 13156397

(51) Int. Cl.
| | |
|---|---|
| *H01L 21/316* | (2006.01) |
| *H01L 29/02* | (2006.01) |
| *H01L 21/02* | (2006.01) |
| *H01L 21/306* | (2006.01) |

(52) U.S. Cl.
CPC .......... *H01L 29/02* (2013.01); *H01L 21/02181* (2013.01); *H01L 21/02236* (2013.01); *H01L 21/0228* (2013.01); *H01L 21/02304* (2013.01); *H01L 21/02312* (2013.01); *H01L 21/02381* (2013.01); *H01L 21/02488* (2013.01); *H01L 21/02499* (2013.01); *H01L 21/02532* (2013.01); *H01L 21/0262* (2013.01); *H01L 21/02658* (2013.01); *H01L 21/02255* (2013.01); *H01L 21/306* (2013.01)

(58) Field of Classification Search
CPC ..................... H01L 21/0228; H01L 21/02164; H01L 21/3141; H01L 21/28194; H01L 21/02181; H01L 21/02359
USPC ........ 438/762, 770, 773, FOR. 398; 148/33.3
See application file for complete search history.

(56) References Cited

U.S. PATENT DOCUMENTS

| | | | |
|---|---|---|---|
| 6,703,708 | B2 | 3/2004 | Werkhoven et al. |
| 8,728,832 | B2 * | 5/2014 | Raisanen et al. ................ 438/14 |
| 2001/0031562 | A1 * | 10/2001 | Raaijmakers et al. ........ 438/770 |
| 2004/0016394 | A1 | 1/2004 | Castovillo et al. |
| 2004/0092096 | A1 | 5/2004 | Raaijmakers et al. |
| 2004/0132317 | A1 | 7/2004 | Morgen et al. |
| 2004/0180557 | A1 | 9/2004 | Park et al. |
| 2005/0239297 | A1 * | 10/2005 | Senzaki et al. ................ 438/785 |

(Continued)

OTHER PUBLICATIONS

European Search Report, European Patent Application No. 13156397.5, dated Jul. 17, 2013.

(Continued)

*Primary Examiner* — George Fourson, III
(74) *Attorney, Agent, or Firm* — McDonnell Boehnen Hulbert & Berghoff LLP

(57) ABSTRACT

A Si or Ge semi-conductor substrate includes an oxygen monolayer on a surface thereof. The oxygen monolayer can be fractional or complete. A $Si^{4+}$ or $Ge^{4+}$ oxidation state of the surface of the Si or Ge substrate, respectively, resulting from the presence of the oxygen monolayer represents less than 50%, preferably less than 40% and more preferably less than 30% of the sum of $Si^{1+}$, $Si^{2+}$, $Si^{3+}$ and $Si^{4+}$ oxidation states or the sum of $Ge^{1+}$, $Ge^{2+}$, $Ge^{3+}$ and $Ge^{4+}$ oxidation states, respectively, as measured by XPS.

18 Claims, 14 Drawing Sheets

(56) References Cited

U.S. PATENT DOCUMENTS

| | | | |
|---|---|---|---|
| 2007/0031598 A1 | 2/2007 | Okuyama et al. | |
| 2007/0134861 A1* | 6/2007 | Han et al. | 438/197 |
| 2007/0264837 A1 | 11/2007 | Rachmady et al. | |
| 2009/0232985 A1 | 9/2009 | Dussarrat et al. | |
| 2011/0263137 A1* | 10/2011 | Mahajani | 438/785 |

OTHER PUBLICATIONS

Lambers, Jochen et al., "Infrared Spectra of Photochemically Grown Suboxides at the Si/SiO2 Interface", Journal of Applied Physics, vol. 94, No. 5, Sep. 1, 2003, pp. 2937-2941.

Webb, Lauren J. et al., "High-Resolution Soft X-ray Photoelectron Spectroscopic Studies and Scanning Auger Microscopy Studies of the Air Oxidation of Alkylated Silicon (111) Surfaces", J. Phys. Chem. B, Oct. 31, 2006, vol. 110, pp. 23450-23459.

Jandhyala, Srikar et al., "Atomic Layer Deposited Al2O3 Dielectrics Using Ozone Functionalization of Graphene", 2011 IEEE Nanotechnology Materials and Devices Conference, Oct. 18-21, 2011, Jeju, Korea, pp. 94-97.

Wang, L. et al., "Control of Interfacial Silicate Between HfO2 and Si by High Concentration Ozone", Applied Physics Letters, vol. 88, Feb. 13, 2006, pp. 072903-1-072903-3.

Onsia, B. et al., "On the Application of a Thin Ozone Based Wet Chemical Oxide as an Interface for ALD High-k Deposition", Solid State Phenomena, vol. 103-104, Apr. 2005, pp. 19-22.

Gusev, E.P. et al., "Ultrathin HfO2 Films Grown on Silicon by Atomic Layer Deposition for Advanced Gate Dielectrics Applications", Microelectronic Engineering, vol. 69, 2003, pp. 145-151.

Heyns, M. et al., "Ultimate Scaling of CMOS Logic Devices With Ge and III-V Materials", MRS Bulletin, vol. 34, Jul. 2009, pp. 485-492.

Nyns, L. et al., "HfO2 Atomic Layer Deposition Using HfCL4/H20: The First Reaction Cycle", Journal of Electrochemical Society, vol. 155, No. 12, Oct. 7, 2008, pp. G269-G273.

Meuris, M. et al., "The IMEC Clean: A New Concept for Particle and Metal Removal of Si Surfaces", Solid State Technology, vol. 38, Issue 7, pp. 109-112.

* cited by examiner

A  B  C

OXYGEN MONOLAYER ON A SEMICONDUCTOR

CROSS-REFERENCE TO RELATED APPLICATION

This application claims priority to European Patent Application No. 13156397.5 filed on Feb. 22, 2013, the contents of which are hereby incorporated by reference.

TECHNICAL FIELD OF THE DISCLOSURE

The present disclosure relates to the field of semiconductor substrates for the fabrication of semiconductor devices, such as, for example, Field Effect Transistors. The present disclosure also relates to methods for the preparation of such substrates.

BACKGROUND OF THE DISCLOSURE

The next generation of semiconductor devices will benefit from thin dielectrics in order to achieve low equivalent oxide thickness. However, thin dielectrics lead to increased leakage current. High-k dielectrics have been considered as a potential candidate to replace silicon dioxide. A technique widely studied for the deposition of such high-k dielectrics is Atomic Layer Deposition (ALD). ALD has the advantage of enabling control of the dielectric thickness at the single atomic layer level.

Ge and Si tend to oxidize in air and form a so-called native oxide layer on their surface. This native oxide layer is however an insulator of relatively poor quality and its thickness is variable. A typical operation before high-k deposition is therefore the removal of this native oxide layer. For Si, this is typically performed by a cleaning step in a HF solution. The resulting surface is hydrogen terminated and therefore hydrophobic.

High-k dielectric materials tend not to nucleate properly on hydrophobic surfaces. For instance, Gusev et al. (Microelec. Eng., 69, 145 (2003)) demonstrated that $HfO_2$ nucleates poorly on H-terminated Si substrates, resulting in high transistor gate leakage current. A more reactive surface is required to enable chemisorption of high-k dielectric ALD precursors. Chemisorption reactions depend on reactivity and on the number of surface sites. Obtaining a complete hydrophilic surface having an as limited as possible impact on the quality of the dielectric layer is a much sought-after target. For the moment, a common approach to make the Si substrate hydrophilic is, after removal of contamination, to oxidize the Si substrate by rapid thermal oxidation. The thickness of the hydrophilic layer obtained is however difficult to control and typically relatively thick.

M. Meuris et al. (Solid State Technology, 38, 109 (1995)) discloses a method wherein a Si substrate is cleaned by a wet process involving a 30 second exposure to a 2% HF solution. This leads to the removal of the native $SiO_2$ layer and to making the Si substrate hydrophobic. After removal of the native $SiO_2$ layer, the substrate is reoxidized in 20 ppm $O_3/H_2O$ until a 1 nm hydrophilic $SiO_2$ layer is obtained. The thickness of the obtained silicon oxide layer is however around 1 nm, which unnecessarily increases the equivalent oxide thickness.

B. Onsia et al. (UCPSS VII, Solid State Phenomena, 103-104, 19 (2005)) discloses a similar approach wherein the ozone ($O_3$) concentration was reduced to 1-5 ppm $O_3/H_2O$ (scaled wet oxide). This approach reduced the oxide thickness down to c.a. 0.3 nm, i.e., to the thickness of a monolayer.

However, the hydrophilic layer appeared incomplete. $HfO_2$ was grown on this substrate by ALD, and RBS measurement indicated some level of substrate inhibition. Also, a poly-Si gate electrode layer grown on top of the $HfO_2$ layer showed epitaxial alignment of some grains with the substrate, which indicated the presence of holes in the scaled wet oxide and the $HfO_2$ layers.

Further experiments performed by L. Nyns et al. (J. Electrochem. Soc., 155, G269 (2008)) confirmed that scaled wet oxides grow in islands (see, e.g., FIG. 2B and FIG. 3). Therefore, a problem with this approach is that Si—OH moieties (good ALD nucleation sites) created thereby are present only in small oxide islands on the substrate, leaving much of the substrate surface with Si—H moieties (bad ALD nucleation sites). This leads to islands of high-k dielectric ALD materials surrounded by high-k free substrate areas.

Generally, it is desirable to develop ways to enable good high-k nucleation on a Si or Ge substrate, which keeps the equivalent oxide thickness to a minimum.

Furthermore, according to the International Technology Roadmap for Semiconductors, high-mobility materials to replace traditional Si channels will be desired to continue scaling of CMOS from the 12 nm node onward. Major issues arose in the quest for Ge and III-V channels, the most challenging of which were important defect densities and very difficult to passivate gate stack interfaces (M. Heyns and W. Tsai, MRS Bulletin 34, 485-492, 2009). An alternative could be offered by silicon/dielectric superlattices, consisting of alternating periods of silicon atoms and foreign atoms such as O, N, or C atoms. These superlattices are affirmed to offer an enhanced mobility in the lateral direction combined with reduced gate leakage in the vertical direction. Such a superlattice avoids the problem of large lattice mismatch during epi growth and offers a normal Si surface for gate stack passivation. However, the interlayer of foreign atoms between two layers of epitaxial silicon material is preferably kept as thin as possible.

Generally, it is desirable to find ways to enable good Si or Ge epitaxial growth on a Si or Ge substrate, which keeps the foreign atom interlayer as thin as possible.

SUMMARY OF THE DISCLOSURE

Generally, the present disclosure teaches useful methods for providing an oxygen monolayer on a silicon (Si) or germanium (Ge) substrate.

In accordance with various embodiments disclosed herein, a substrate may be provided having a continuous distribution of hydrophilic surface groups. In addition, a substrate may be provided having an as thin as possible hydrophilic layer on a surface thereof. Further, a substrate may be provided having a continuous monolayer of hydrophilic surface groups. Still further, a substrate having a monolayer of hydrophilic reactive oxygen sites having a higher reactivity than hydrophobic Si—H sites (such as on a H-passivated Si surface) can be provided. This facilitates true two-dimensional growth of the substrate instead of random deposition or island growth.

In a first example, the present disclosure relates to a Si or Ge semi-conductor substrate comprising an oxygen (O) monolayer on a surface thereof. The oxygen monolayer can be fractional or complete. In addition, a $Si^{1+}$ or $Ge^{4+}$ oxidation state of the surface of the Si or Ge substrate, respectively, resulting from the presence of the oxygen monolayer represents less than 50%, preferably less than 40%, and more preferably less than 30% of the sum of $Si^{1+}$, $Si^{2+}$, $Si^{3+}$ and $Si^{4+}$ oxidation states or the sum of $Ge^{1+}$, $Ge^{2+}$, $Ge^{3+}$ and $Ge^{4+}$ oxidation states, respectively, as measured by XPS.

This oxygen monolayer can be beneficial or useful because it introduces reactive sites on the surface, thereby enabling chemisorptions of ALD precursors. This can facilitate at least a steady growth per cycle of the ALD layer and can enhance the substrate in one or more ways. As a result, ALD performed on the substrate may not result in island growth of random deposition. Furthermore, a monolayer can be ideal because it is the thinnest possible layer, thereby contributing as little thickness as possible to the equivalent oxide thickness.

A complete monolayer can be used as it facilitates the formation of a complete ALD layer on top thereof and, thereby, permits homogeneous electronic properties across the whole surface of the substrate.

The Si or Ge substrate may be any such substrate. For example, it may be a Si(100) or a Ge(100) substrate.

As used herein and unless provided otherwise, the term oxygen monolayer refers to a layer of oxygen atoms chemically linked to a substrate surface and covering the substrate with a number of oxygen atoms corresponding to between at least half of the minimum number of atoms theoretically required to cover the substrate surface entirely and at most one and a half times this minimum number. In the example of Si(100) as a substrate, this corresponds to from between about $3.39*10^{14}$ to $1.02*10^{15}$ at/cm$^2$ as determined by Si capped SIMS. In this example, $3.39*10^{14}$ at/cm$^2$ corresponds to exactly half a monolayer, $6.78*10^{14}$ at/cm$^2$ corresponds to exactly one monolayer, and $1.02*10^{15}$ at/cm$^2$ corresponds to 1.5 monolayers.

A perfect or complete monolayer has a single thickness across the whole area it covers, and it covers the complete substrate surface. A fractional monolayer is a layer having holes exposing the semiconductor substrate. In the present disclosure, fractional oxygen monolayers are layers of atoms that form between about 50 to 99.9% of the substrate surface. This represents from between about $3.39*10^{14}$ to $6.7*10^{14}$ at/cm$^2$ on a Si(100) surface. A complete monolayer is a layer having no holes and which atoms cover from between about 100 to 150% of the substrate surface. This represents from between about $6.8*10^{14}$ to $1.0*10^{15}$ at/cm$^2$. This means that a complete first oxygen layer of monoatomic thickness is formed, and that eventually a second layer of oxygen, covering at most 50% of the first layer, is formed thereon. In embodiments disclosed herein, the oxygen monolayer may be from between about 50 to 150% complete. An oxygen monolayer that is about 50% complete refers to a layer that, due to the presence of holes, for example, covers only about 50% of the substrate area subtended by the monolayer.

The oxygen monolayer is a monolayer comprising oxygen. For example, the oxygen monolayer may be a monolayer obtainable by a method of the present disclosure, as discussed below. In embodiments disclosed herein, the oxygen monolayer may be a monolayer resulting from the reaction of ozone with the semiconductor substrate in the conditions of the method discussed below. Chemically, this monolayer may be composed of oxygen species directly chemically bound to the substrate. The monolayer can therefore be characterized by the oxidation level of the substrate atoms bound to the oxygen species. A good characterisation of the oxygen monolayer is that most of the substrate atoms are not in the $Si^{4+}$ or $Ge^{4+}$ oxidation state. This is very different from the oxidation state typically found for conventional (higher temperature) oxidizing conditions. This is also illustrated in FIG. 16. Thicker oxygen (multi)layers are typically composed of Si or Ge oxide, and the oxygen atoms are mostly in the Si or Ge backbond (e.g., Si—O—Si or Ge—O—Ge) with Si or Ge in the (4+) oxidation state. Typically, in the prior art, a large amount of Si or Ge is in higher oxidation states such as 2+, 3+, or 4+.

In embodiments of the present disclosure, the most frequent oxidation state of the Si or Ge substrate on the surface resulting from the presence of the oxygen monolayer may be $Si^{1+}$, as measured by XPS. Consequently, the type of oxygen species linked to such $Si^{1+}$ that forms the monolayer are of the form Si—OH, Si—O, or Si—O—Si, for instance. This can result in the benefit of providing a very hydrophilic surface, promoting two-dimensional growth (see FIG. 2). In some embodiments, at least about 5 at %, and preferably at least about 10 at %, of the oxygen monolayer takes the form of hydroxyls as determined by HfCl4 chemisorption. For instance, the amount of hydroxyls so determined could be from between about 5 to 15 at %.

In embodiments of the present disclosure, the oxygen monolayer may be a complete monolayer. Although a fractional monolayer can be achieved, most practical applications (such as for nucleation of high-k dielectric material) benefit from the presence of a complete monolayer on which a subsequent layer can be overlaid in such a way as to be complete as well.

In embodiments disclosed herein, the oxygen monolayer may have a thickness of from between about 0.30 to 0.38 nm as measured by ellipsometry. This is one way to control for the presence of an oxygen monolayer according to the first example. In addition, the oxygen monolayer may be uniform in thickness.

Further, all oxygen atoms forming the monolayer may be directly covering part of the Si or Ge semi-conductor substrate. The monolayer is therefore not composed of oxygen multilayer structures, such as $SiO_2$ islands. Although embodiments of the present disclosure easily enable and therefore do not exclude the possibility of making oxygen multilayers in a controlled way, it appears that for most current applications, a monolayer is a promising thickness for the oxygen layer since it allows for minimal equivalent oxide thickness, for instance.

In other embodiments, the oxygen monolayer may have from between about $4*10^{14}$ atoms/cm$^2$ to $10*10^{14}$ atoms/cm$^2$, and preferably between about $5*10^{14}$ atoms/cm$^2$ to $9*10^{14}$ atoms/cm$^2$, as measured by Si encapsulated SIMS.

The substrate may further comprise an overlying layer of a semi-conductor or dielectric material, preferably a high-k dielectric material, in contact with the monolayer. An effect of the monolayer is to enable the formation of such an overlaying layer via ALD by promoting nucleation of ALD precursors. The semi-conductor layer may also be an amorphous or an epitaxial semi-conductor layer.

In addition, in some embodiments, at least a second bilayer may overlay the overlying layer, the bilayer including an oxygen monolayer, such as discussed above, overlaid by another overlying layer, such as discussed above. When the bilayer includes an oxygen monolayer overlaid by an epitaxial semi-conductor layer, a stack of at least two of such bilayers correspond to a so called superlattice, a promising material for serving as a channel in FETs.

In a second example, the present disclosure relates to a device that includes the semi-conductor substrate including various embodiments and aspects, as discussed herein. An example of such a device may be a field effect transistor.

In a third example, the present disclosure relates to a method of manufacturing a semi-conductor device, and the method includes providing a Si or Ge semi-conductor substrate substantially free of oxygen contamination and at a temperature of from between about 30° C. to 90° C. This method also includes reacting the semi-conductor substrate with $O_3$ in the gaseous phase at a concentration of from between about 50 to 400 g/m$^3$, at a partial pressure of from between about 0.005 to 0.12 Torr, at a flow rate of from between about 100 sccm to 800 sccm, for a duration of from between about 0.02 to 1.5 s, thereby providing a fractional or complete oxygen monolayer on a surface thereof.

This method results in a true oxygen monolayer and not in the formation of $SiO_x$ or $SiO_2$ islands. This method may further include providing a semi-conducting or dielectric layer directly on top of the monolayer. The dielectric layer may be deposited by ALD, and/or the dielectric layer may be a high-k dielectric layer. The high-k dielectric layer may be a metal oxide layer deposited by an atomic layer deposition process alternating pulses of a precursor to the metal with pulses of water.

Using pulses of water can be particularly beneficial when compared to using pulses of ozone. Indeed, additional ozone pulses could penetrate the oxygen monolayer and increase its thickness to form a thick $SiO_x$ or $SiO_2$ (multi)layer. Water on the other hand preserves the true single layer nature of the oxygen monolayer.

The step of providing a semi-conducting layer directly on top of the monolayer may further include reacting the oxygen monolayer with a precursor to the semi-conductor via Low Pressure Chemical Vapor Deposition, thereby providing an epitaxial semiconductor layer thereon. In this example, the semiconductor precursor flow may be lower than about 0.44 nm/min, and more preferably between about 0.1 nm/min to 0.4 nm/min.

In embodiments where an epitaxial semiconductor layer is provided, the oxygen monolayer may preferably be obtained by reacting the semi-conductor substrate with $O_3$ in the gaseous phase at a concentration of from between about 50 to 150 g/m$^3$, at a flow rate of from between about 100 to 300 sccm, and for a duration of from between about 0.02 s to 0.10 s.

In addition, one or more of the method steps of reacting the semi-conductor substrate with $O_3$ in the gaseous phase and providing a semi-conducting or dielectric layer directly on top of the monolayer may be repeated at least once after the performance of the step of providing the semi-conducting or dielectric layer directly on top of the monolayer.

In some embodiments, providing a Si or Ge semi-conductor substrate substantially free of oxygen contamination involves providing a Si or Ge semi-conductor substrate and applying a HF treatment thereon. The HF treatment may be performed with a HF solution having a concentration of at least about 1% for a time of at least about 20 s (e.g. 2%, 30 s). Further, this cleaning may involve a heating step in a reductive atmosphere (e.g., $H_2$, 850° C., 2 min, 40 torr, 20 slm).

Further, the temperature of the substrate during the reaction may be preferably from between about 40° C. to 80° C., and more preferably from between about 40 to 60° C. This temperature is the temperature of the substrate, e.g., as measured at the level of the chuck in the ALD chamber.

In another example, the $O_3$ may be reacted with the substrate for a time of from between about 0.02 to 30 s, preferably from between about 0.02 to 1.0 s, and more preferably from between about 0.02 to 0.7 s. For a complete oxygen monolayer, it is preferred to use 0.1 s or above. For a partial monolayer, it is preferred to use 0.5 s or below.

In embodiments disclosed herein, the step of reacting the semi-conductor substrate with $O_3$ in the gaseous phase may be performed in an ALD chamber. This step may be performed at a total pressure of from between about 1 to 4 torr.

In various other aspects, the $O_3$ may be provided as an $O_2/O_3$ mixture, preferably having from 10 to 30% of $O_3$. The $O_2/O_3$ mixture may be carried by an inert gas. The reacting gas may be provided at a speed of from between about 200 to 600 sccm. In addition, partial pressure in $O_3$ may be from between about 0.01 to 0.12 Torr, and preferably from between about 0.03 to 0.11 Torr.

In a further aspect, the present disclosure relates to a semi-conductor device obtainable by any method described herein.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change, and evolution of devices in this field, the present concepts are believed to represent substantial new and novel improvements, including departures from prior practices, resulting in the provision of more efficient, stable, and reliable devices of this nature.

The above and other characteristics, features, benefits, and advantages of the present disclosure will further become apparent from the following description, taken in conjunction with the accompanying drawings, which illustrate, by way of example, the principles of the disclosure. This description is given for the sake of example only, without limiting the scope of the disclosure.

Figure 1:
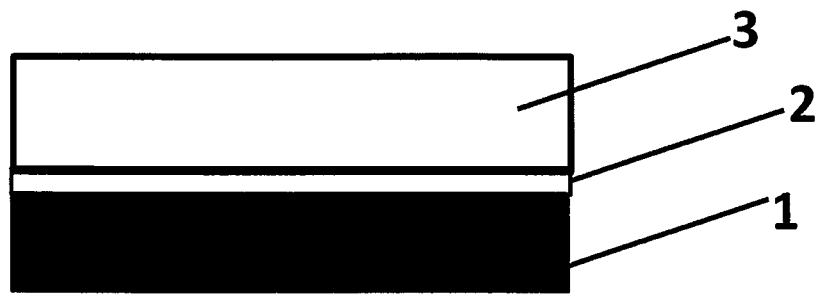
FIG. 1 is a schematic representation of a semi-conductor substrate according to an embodiment of the present disclosure.

In the different figures, the same reference signs refer to the same or analogous elements.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn to scale for illustrative purposes. The dimensions and the relative dimensions may not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B," for example, should not be limited to devices that include only components A and B. Rather, the expression means that with respect to the present disclosure, the relevant components of the device are A and B.

Similarly, it is to be noticed that the term "coupled," also used in the claims, should not be interpreted as being restricted to direct connections only. The terms "coupled" and "connected," along with their derivatives, may be used. It should be understood that these terms are not intended as synonyms for each other. Thus, the scope of the expression "a device A coupled to a device B," for example, should not be limited to devices or systems wherein an output of device A is directly connected to an input of device B. Rather, the expression means that there exists a path between an output of A and an input of B that may be a path including other devices or means. "Coupled" may mean that two or more elements are either in direct physical or electrical contact, or that two or more elements are not in direct contact with each other but yet still co-operate or interact with each other.

Reference throughout this specification to "one embodiment," "an embodiment," "one aspect," "an aspect," "an example," and the like means that a particular feature, structure, or characteristic described in connection with the embodiment or aspect is included in at least one example of the present disclosure. Thus, appearances of the phrases "in one embodiment," "in an embodiment," "in one aspect," "in an aspect," "in one example," and the like in various places throughout this specification are not necessarily all referring to the same embodiment, aspect, or example, but may. Furthermore, the particular features, structures, or characteristics may be combined in any suitable manner, as would be apparent to one of ordinary skill in the art from this disclosure, in one or more embodiments.

Similarly it should be appreciated that in the description of embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those skilled in the art. For example, in the appended claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

The disclosure will now be described by a detailed description of several embodiments of the disclosure. It is clear that other embodiments of the disclosure can be configured according to the knowledge of persons skilled in the art without departing from the true spirit or technical teaching of the disclosure.

Reference will be made to transistors. These are three-terminal devices having a first main electrode such as a drain, a second main electrode such as a source, and a control electrode such as a gate for controlling the flow of electrical charges between the first and second main electrodes.

Figure 2:
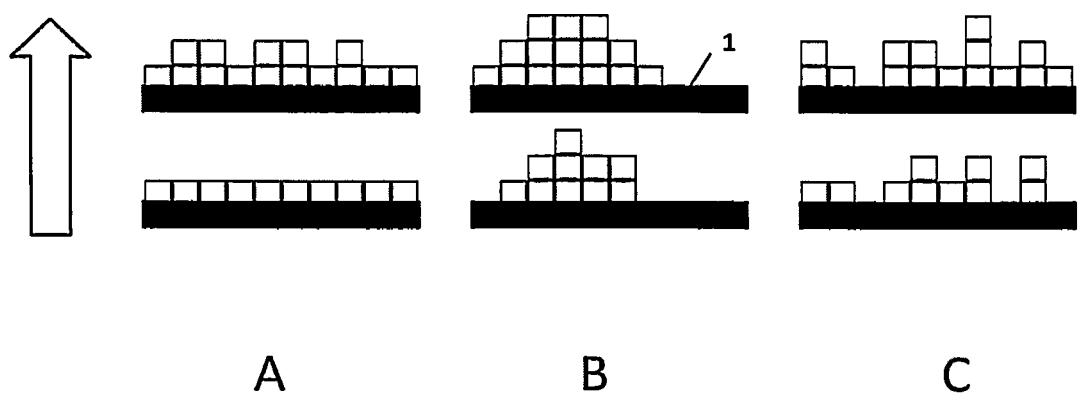
FIG. 2 is a schematic representation showing different ALD growth modes.
Figure 3:
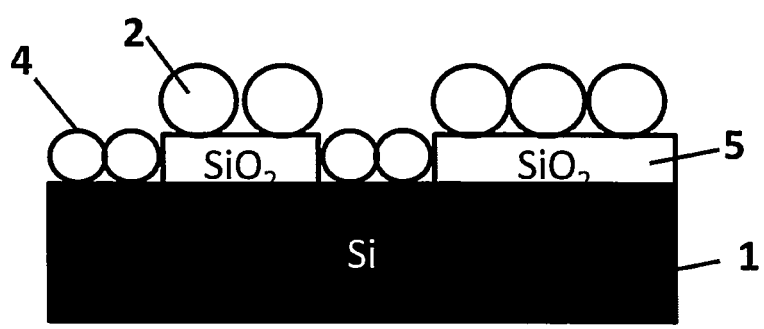
FIG. 3 is a schematic representation of a semi-conductor substrate according to the prior art.

FIG. 2 illustrates an example of the present disclosure. Three columns (A, B and C) are shown in FIG. 2. Column A depicts two-dimensional growth as enabled by embodiments of the present disclosure. Column B depicts island growth. Column C depicts random deposition. The upward pointing arrow indicates the direction of increasing number of cycles. For each situation, a substrate 1 is represented on which an ALD layer (white squares) is grown. As indicated above, situation A is the situation enabled by embodiments of the present disclosure. The bottom substrate is depicted having a few ALD precursors having reacted with the substrate 1, thereby providing a very incomplete ALD layer. It is worth noticing that for a low number of cycles, this situation is found in all three situations A, B, and C. The middle substrate is depicted having a first layer of ALD material thereon. It is worth noting that this layer is complete, uniform and that new ALD material deposits in the lowest unfilled material layer. The top substrate shows the situation when the number of cycles is increased further. A second layer builds up on the first layer until it forms a complete layer. A true two-dimensional growth is therefore obtained, wherein only a maximum of two different thicknesses of ALD material can be measured, and wherein the difference in thickness is the thickness of one monolayer.

Situation B is the situation typically encountered in attempts of the prior art. In this situation, the relatively low reactivity of the oxide ($SiO_2$ or $GeO_2$ with a high proportion of $Si^{4+}$ or $Ge^{4+}$) hydrophilic material used to enable chemisorption of the ALD precursors results in the preferential growth of new ALD material on previously deposited ALD material. The result is the so-called island growth, wherein multilayer ALD material islands are surrounded by ALD material-free substrate areas.

Situation C is another situation where the probability of deposition on the hydrophilic surface is equal to the probability of deposition on the previously deposited ALD material. The deposition in that case is random.

Example 1

Si Substrate Overlaid by an Oxygen Monolayer

In this first example, a 200 mm Si(100) substrate was cleaned through contact with a 2% HF(aq) solution for 30 s. The substrate was thereafter heated up for 2 min at a temperature of 850° C. and a pressure of 40 Torr under a $H_2$ flow (20 Standard Liter per Minute (slm)) provided by a Epsilon® Poly Si CVD. The substrate was then cooled down to 350° C. in a $H_2$ atmosphere. The resulting substrate having a hydrophobic H-terminated surface was thereafter reacted with $O_3$ (provided by an ALCVD Pulsar® 2000) as follows. The substrate was kept at 50° C. for up to 30 s under a $N_2$ flow (2.4 slm) and a $O_2/O_3$ flow (600 sccm, 350 g/m³ (about 20% $O_3$)) under a pressure of 1 Torr. This treatment made the surface of the substrate hydrophilic by depositing a single monolayer of oxygen thereon.

Figure 4:
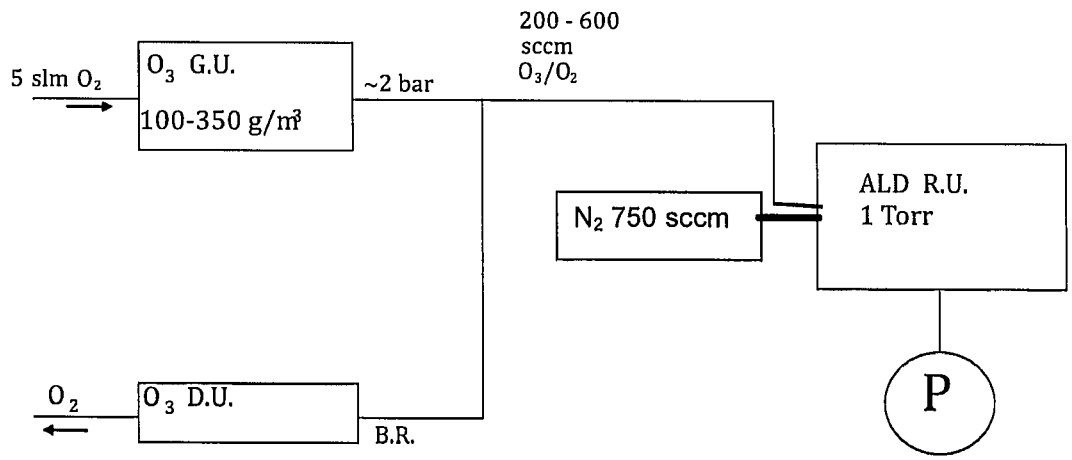
FIG. 4 is a diagrammatic illustration of an apparatus adapted for performing a method according to an embodiment of the present disclosure.

The hardware configuration for the $O_3$ treatments used in the illustrated embodiments of the present disclosure is shown in FIG. 4. The temperature of the reactor unit (R.U.) was in the range 50-80° C. (50° C. in example 1). The $O_3$ exposure time was set in the range 50 ms to 1 s. The total pressure was set at 1 Torr and the partial pressure in $O_3$ was set in the range 0.01 and 0.08. Other values of temperature, total pressure, partial $O_3$ pressure, exposure time and of the other parameters can be used as well but the values depicted in FIG. 4 are typical.

Figure 5:
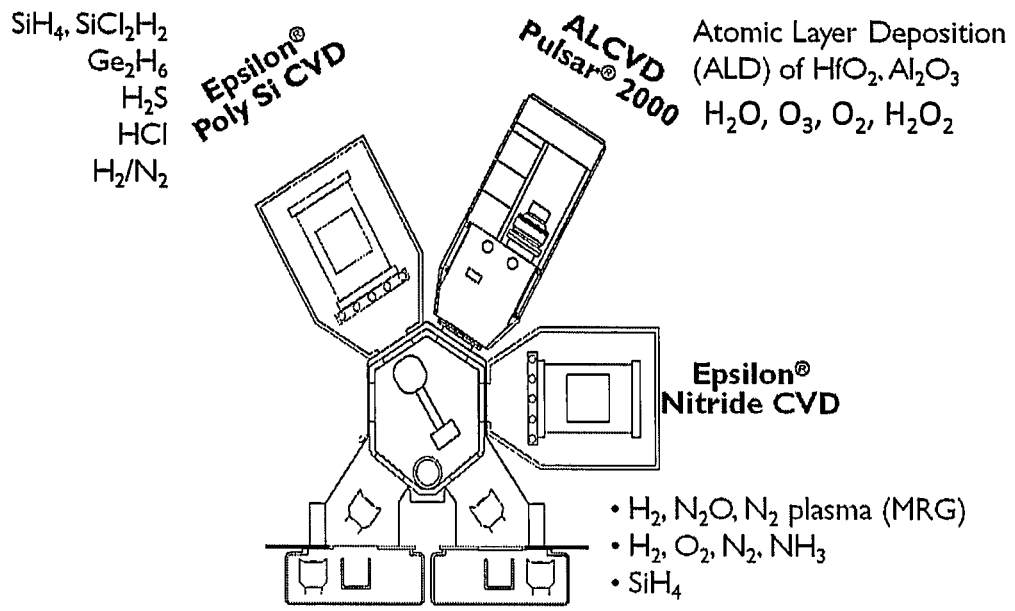
FIG. 5 is a schematic representation of an apparatus adapted for performing a method according to an embodiment of the present disclosure.

With reference to FIG. 4, 5 slm $O_2$ was provided in an $O_3$ generator unit (G. U.) thereby generating $O_3$ at a concentration of from 100 to 350 g/m³. The $O_3$ gas was then supplied to an ALD reactor unit (R.U.) at a pressure of 2 bar and a flow of 200-600 sccm. Together with the $O_3$ gas, $N_2$ was provided in the ALD R.U. with a flow of 750 sccm. The ALD reactor unit was maintained at a pressure of 1 Torr via the use of a pump P. An $O_3$ destruction unit (D.U.) is connected to the system via a backpressure regulator (B.R.). An example hardware configuration that can be used is shown in FIG. 5. FIG. 5 shows a 200 MM Polygon cluster comprising a dispatching center surrounded by an Epsilon® Poly Si CVD, an ALCVD Pulsar® 2000, and an Epsilon® Nitride CVD. The gases that can typically be used by each unit are listed in FIG. 5.

The following table shows other experiments that have been performed in an analogous fashion. A HF clean was performed for each sample. Some samples were heated up to 850° C. then cooled down to 350° C. in $H_2$ like above, others where cooled down to 350° C. in $N_2$ (to provide a bare Si surface), and others yet were not baked. XPS was performed on each sample directly after the experiment.

| Sample name | Baking in gaseous atmosphere | $O_3$ time exposure (s) |
| --- | --- | --- |
| D02 | No | No |
| D03 | No | 0.1 |
| D04 | No | 1 |
| D05 | No | 2 |
| D06 | No | 30 |
| D16 | Yes, cooling in $H_2$ | No |
| D17 | Yes, cooling in $H_2$ | 0.5 |
| D18 | Yes, cooling in $H_2$ | 0.75 |
| D19 | Yes, cooling in $H_2$ | 1 |
| D20 | Yes, cooling in $H_2$ | 5 |
| D21 | Yes, cooling in $N_2$ | 0.5 |
| D22 | Yes, cooling in $N_2$ | 0.75 |
| D23 | Yes, cooling in $N_2$ | 1 |
| D24 | Yes, cooling in $N_2$ | 5 |

Figure 6:
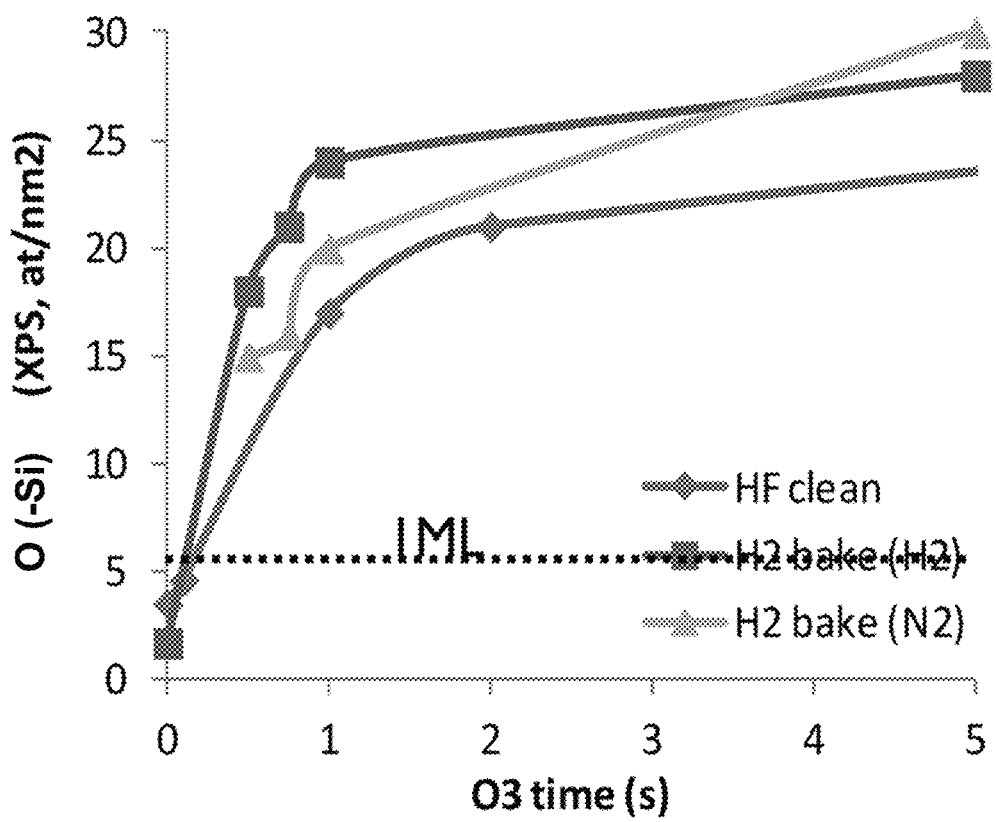
FIG. 6 is a graph of the concentration of oxygen atoms linked to silicium atoms versus ozone treatment time as measured by XPS in an embodiment of the present disclosure.

FIG. 6 shows the oxygen coverage as a function of $O_3$ exposure time for three different substrate pre-treatments. The oxygen coverage was evaluated by ex-situ XPS. The oxygen coverage determined in this way was not quantitative due to exposure to air during the ex-situ experiment.

Figure 7:
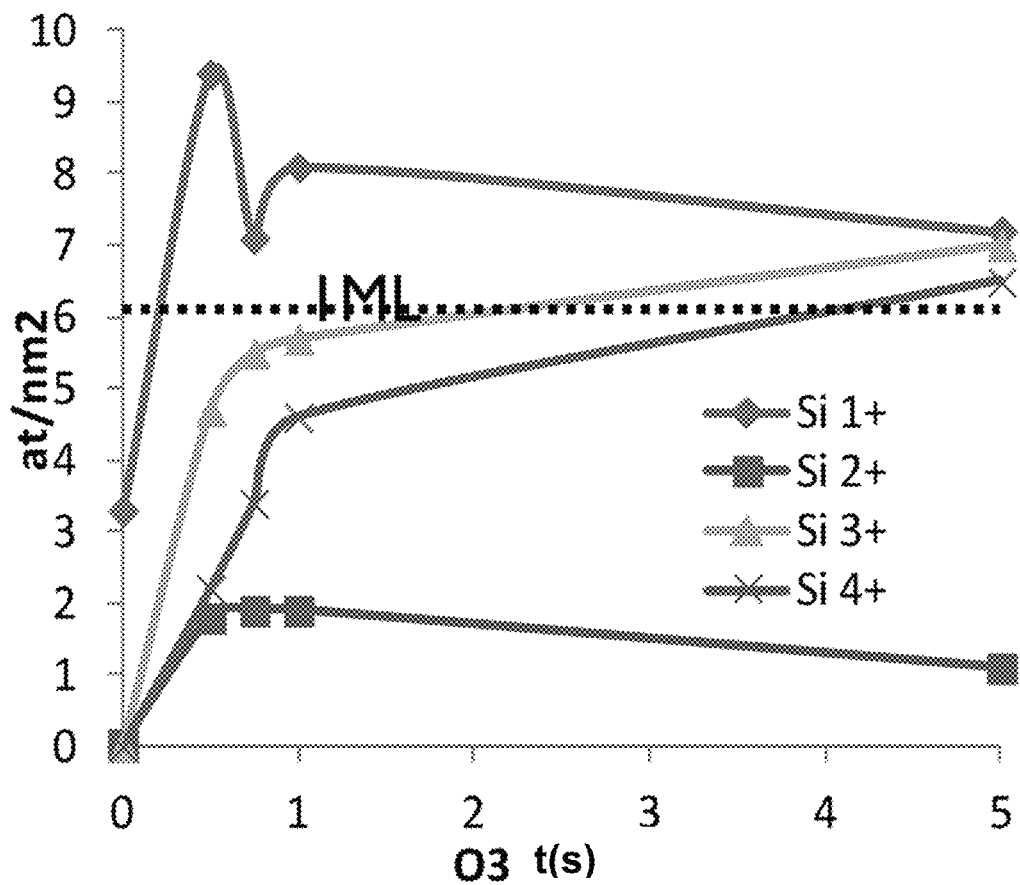
FIG. 7 is a graph of the concentration of silicium atoms having different oxidation states versus ozone treatment time as measured by XPS in an embodiment of the present disclosure.
Figure 8:
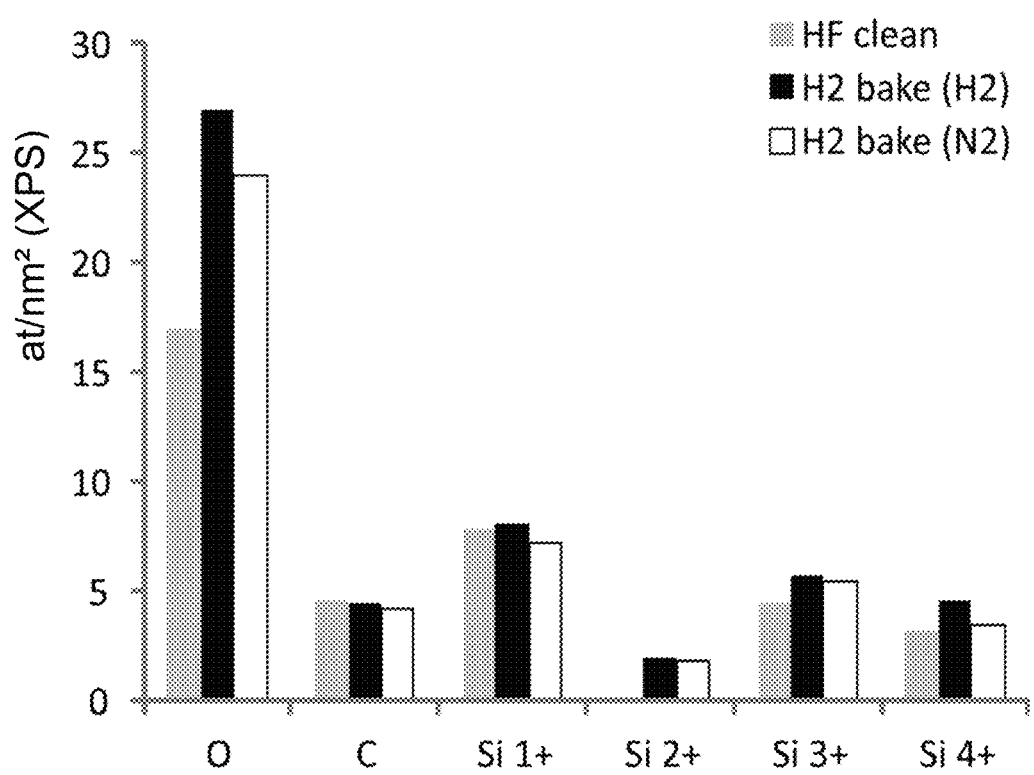
FIG. 8 is a graph of the concentration of O, C, and Si atoms having various oxidation states in a substrate pre-treatment procedure according to embodiments of the present disclosure.

Nevertheless, it could be demonstrated by these experiments that for the shortest $O_3$ pulse times, $Si^{1+}$ is by far the most frequent oxidation state of the Si substrate, reaching about 50% of the Si cation oxidation states at 500 ms (up to 9 $Si^{1+}/nm^2$, see FIG. 7). It could also be concluded that increasing the $O_3$ exposure time increases $Si^{3+}$ and $Si^{1+}$ without increasing $Si^{2+}$. In FIG. 8, the hashed bars represent substrates that underwent a HF clean before $O_3$ exposition, the black bars represent substrates that underwent a HF clean and a $H_2$ bake with cooling in $H_2$, and the white bars represent substrates that underwent a HF clean and a $H_2$ bake with cooling in $N_2$. FIG. 8 shows that the prevalence of $Si^{1+}$ over the other Si oxidation state is largely independent of the substrate pre-treatment. The determination of the actual oxygen layer thickness was determined in example 5, discussed below.

Example 2

Effect of Temperature on the Oxygen Monolayer

Four experiments were performed in this example. For each experiment, example 1 was repeated except that the partial pressure in oxygen was fixed at 0.08 Torr (155 g/m$^3$) and that the temperature was set at one of the following temperatures: 40° C., 50° C., 60° C., and 80° C.

Figure 9:
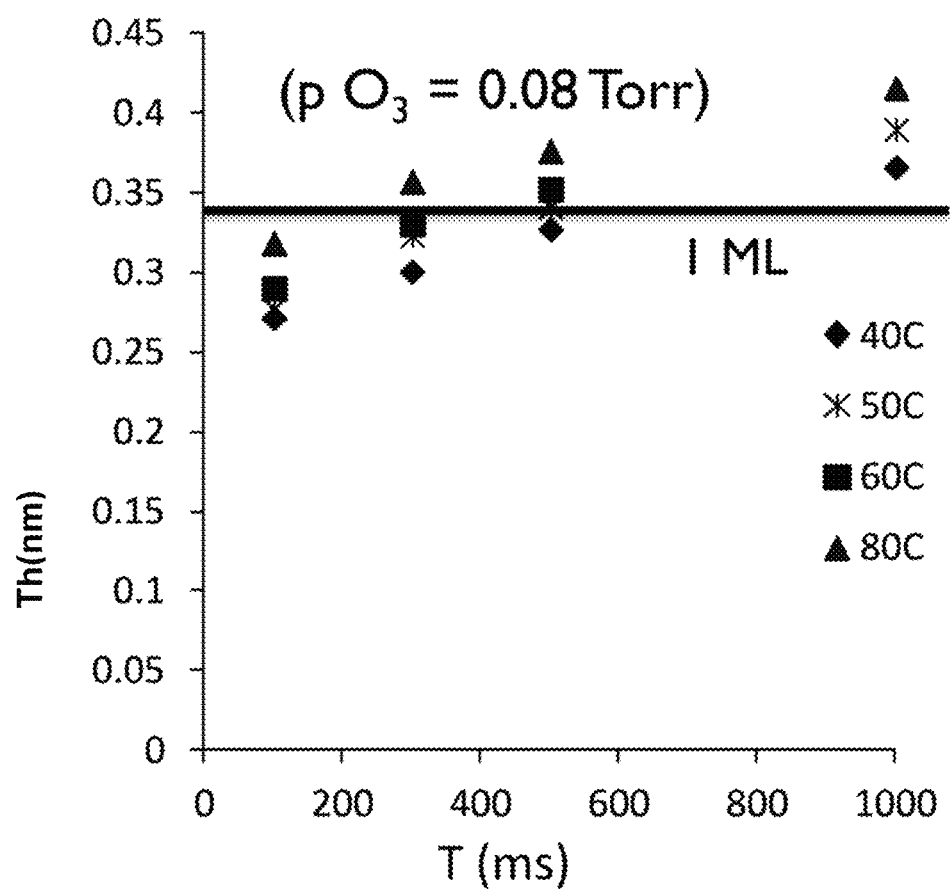
FIG. 9 is a graph of the oxygen layer thickness versus the ozone exposure time at various temperatures according to embodiments of the present disclosure.

The resulting substrate-oxygen layer assemblies were analysed by time coordinated (<10 minutes) ex-situ ellipsometry (averaged over 9 points). The results are shown in FIG. 9. The 1 ML horizontal line corresponds to the thickness of one monolayer as determined by Si-encapsulated SIMS (see example 4 below). From these experiments, it can be seen that an oxygen thickness corresponding to one monolayer can be obtained for each of the tested temperatures (40-80° C.) by increasing the ozone exposure time (e.g. up to 700 ms) for lower temperature, and decreasing the ozone exposure time (e.g. down to 200 ms) for higher temperatures.

Example 3

Effect of $O_3$ Partial Pressure on the Oxygen Monolayer

Three experiments were performed in this example. For each experiment, example 1 was repeated except that the partial pressure in oxygen was set at one of the following values: 0.01 Torr (22 g/m$^3$), 0.02 Torr (44 g/m$^3$), and 0.08 Torr (155 g/m$^3$).

Figure 10:
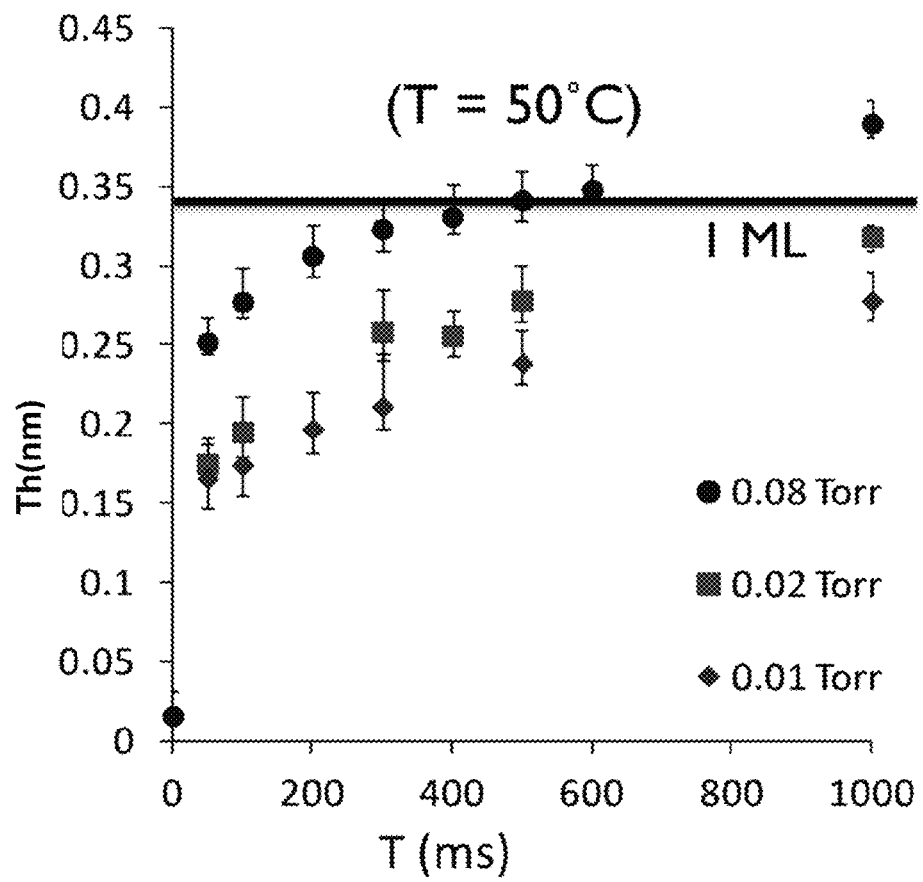
FIG. 10 is a graph of the oxygen layer thickness versus the ozone exposure time at various pressures in embodiments of the present disclosure.

The resulting substrate-oxygen layer assemblies were analysed by time coordinated (<10 minutes) ex-situ ellipsometry (averaged over 9 points). The results are shown in FIG. 10. The 1 ML horizontal line corresponds to the thickness of one monolayer as determined by Si-encapsulated SIMS (see, e.g., example 5). The error bars indicate minimum and maximum observed thicknesses. These experiments suggest that an oxygen thickness corresponding to one monolayer can be obtained in a range of $O_3$ partial pressures encompassing each of the tested partial pressures. For the value of 0.02 and 0.01 Torr, times longer than 1 s appear necessary at 50° C. For the value of 0.08 Torr, 500 ms appear adequate at 50° C. Lower ozone partial pressure requires longer ozone exposure time while higher ozone partial pressure requires shorter ozone exposure time.

Example 4

Figure 15:
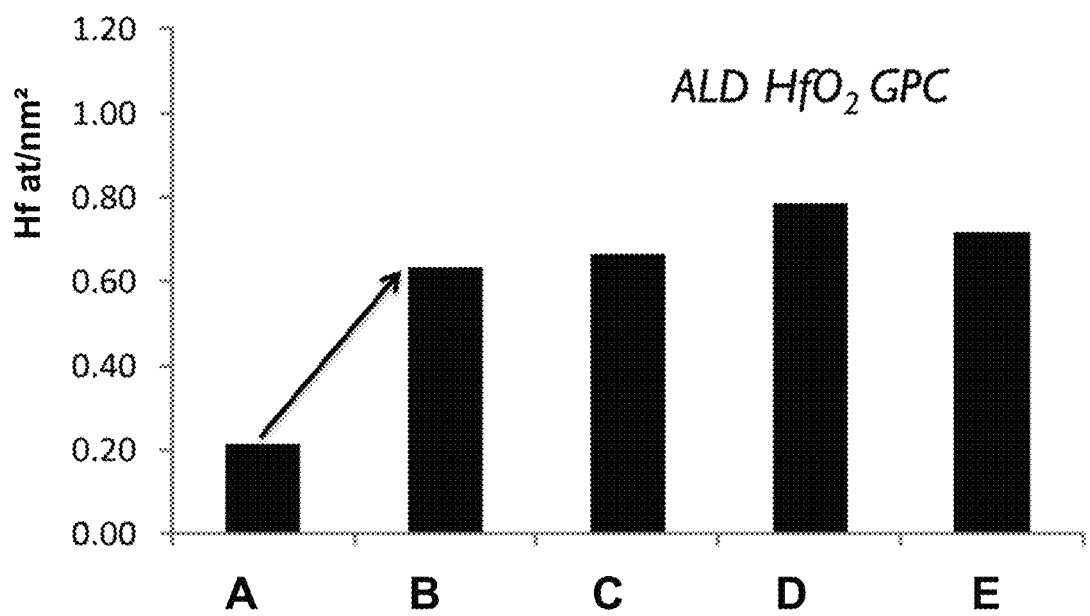
FIG. 15 is a graph of the Hf surface coverage for various embodiments of the present disclosure.

Chemical Characterization of the Substrate Obtained in Example 1 by $HfCl_4$ Chemisorption In this example, the substrate obtained in example 1 was exposed to $HfCl_4$ at 300° C. in an ALD reactor in order to assess via Rutherford Backscattering Spectroscopy the Hf coverage thereby obtained and to link it to the OH density on the silica surface. The rationale behind this analytical method was developed in L. Nyns et al., J. Electrochem. Coc. 155, G269, 2008. FIG. 15 shows the results of the experiment. The bar A corresponds to a substrate that has been cleaned and transported into the ALD chamber but which has not been exposed to ozone (unlike embodiments of the present disclosure). The bar B corresponds to the substrate obtained at the end of an experiment analogous to example 1, e.g., with an oxygen monolayer thereon, except that the substrate was cooled down to 350° C. in a $H_2$ atmosphere before $O_3$ treatment.

The bar C corresponds to the sample of bar B after annealing at 500° C. The bar D corresponds to the substrate obtained at the end of example 1, e.g., with an oxygen monolayer thereon, wherein the substrate was cooled down to 350° C. in a $N_2$ atmosphere before $O_3$ treatment. The bar E corresponds to the sample of bar D after annealing at 500° C. An observation that can be made is that samples B and D are similar. Also, samples C and E are similar. Another observation that can be made is that the Hf coverage is 3 to 4 times larger on $O_3$ treated substrates when compared with the non-$O_3$ treated sample of bar A. This Hf coverage can be translated for the $O_3$ treated samples to a OH coverage corresponding to 0.10 to 0.15 monolayers. Since the thickness of the oxygen monolayer in the $O_3$ treated samples of example 1 has been evaluated by SIMS (see example 5 below) to amount to somewhat less than 1.2 monolayers, it can be concluded that 85 to 95% of the oxygen monolayer takes the form of oxygen within the Si backbond while 5 to 15% of the oxygen monolayer takes the form of hydroxyls. Furthermore, annealing to 500° C. does not appear to have a significant effect on these results. The chemical composition of the oxygen monolayer is therefore stable at least up to 500° C.

This experiment not only gives an indication of the chemical nature of the oxygen present in the oxygen monolayer, but it also demonstrates the possibility to grow $HfO_2$ on the Si substrate comprising the oxygen monolayer. It is noteworthy that the Hf coverage is enhanced up to 0.8 Hf at/nm$^2$ when compared to the substrate without $O_3$ treatment (bar A). In this example, 0.8 Hf at/nm$^2$ is close to the steady growth per cycle of $HfO_2$, which is 1.2 Hf/nm$^2$. The enhancement is by a factor of 3 to 4. The growth of $HfO_2$ on the Si substrate comprising the oxygen monolayer is the subject of example 10 below.

Example 5

Ge Substrate Overlaid by an Oxygen Monolayer

Example 1 was repeated except that a 100 mm Ge(100) substrate was used instead of a 200 mm Si substrate and the $H_2$ bake was performed at 650° C. for 10 minutes instead of 850° C. for 2 min.

Figure 17:
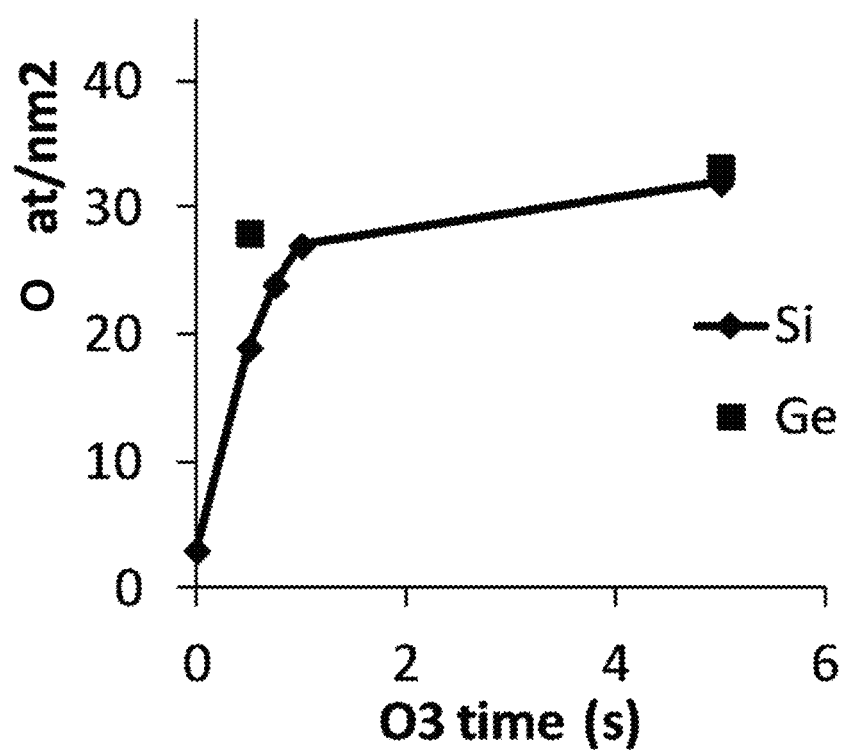
FIG. 17 is a graph of the oxygen Ge and Si surface coverage as a function of ozone exposure time in embodiments of the present disclosure.

FIG. 17 shows the oxygen coverage as a function of $O_3$ exposure time for equivalent Si and Ge substrates obtained by examples 1 and 5, respectively. The oxygen coverage was evaluated by ex-situ XPS. The oxygen coverage determined in this way was not quantitative due to exposure to air involved in the ex-situ experiment.

Figure 16:
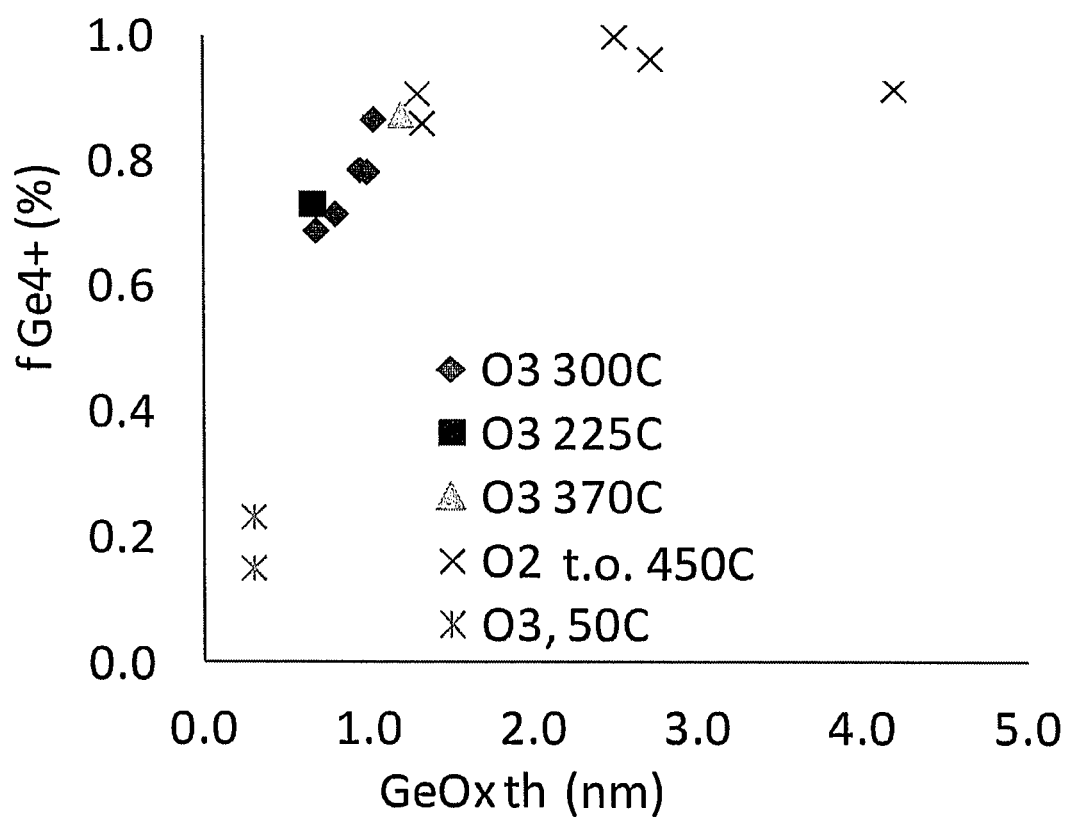
FIG. 16 is a graph of the fraction of $Ge^{4+}$(%) as a function of the $GeO_x$ thickness (nm) in embodiments and comparative examples.

Nevertheless, it could be demonstrated by this experiment that the 0 content is of comparable value and varies in a very similar fashion for both Si and Ge substrates as a function of $O_3$ exposure time. FIG. 16 shows the fraction of $Ge^{4+}$ oxidation state observed by XPS in the interfacial layer for example 5 (stars), as well as, for comparative examples performed in analogous conditions except that the temperature has been set too high (225° C., squares; 300° C., diamonds; 370° C., triangles) or that $O_2$ has been used instead of $O_3$ ($O_2$ at 450° C., crosses). Only in the case of example 5, is there observed a low fraction of $Ge^{4+}$ compared to the other Ge oxidation states. $Ge^{4+}/(Ge^{1+}+Ge^{2+}+Ge^{3+}+Ge^{4+})<30\%$. In all the comparative examples, this fraction is above 60%.

Example 6

Amorphous Si-Capped Oxygen Monolayer

Example 6a

Amorphous Si-Capped Oxygen Monolayer on $N_2$ Cooled Substrate

Chemical Vapor Deposition (CVD) of Si was performed on the hydrophilic substrate obtained in example 1. In this example, the substrate was brought to 500° C. under a pressure of 40 Torr and under a flow of $SiH_4$ of 75 standard cubic centimeters per minute (sscm) and nitrogen flow of 20 slm provided by an Epsilon® Poly Si CVD. The exposure time to the $SiH_4$ flow was 180 min. The thickness of the resulting Si cap layer was 80 nm. The growth rate was about 0.44 nm/min.

Example 6b

Amorphous Si-Capped Oxygen Monolayer on $H_2$ Cooled Substrate

Example 6a has been repeated on a substrate obtained in an analogous way to example 1 except that the substrate was cooled down to 350° C. in a $H_2$ atmosphere before $O_3$ treatment.

Example 7

SIMS Analysis on the Samples of Example 6

A SIMS analysis was performed on the samples 6a and 6b. The thereby measured oxygen and carbon coverage are indicated in the table below.

|  | O/nm2 | C/nm2 |
|---|---|---|
| $H_2$ bake ($H_2$) | 0.09 | 0.01 |
| $H_2$ bake ($H_2$) - ALD reactor | 0.30 | 0.03 |
| $H_2$ bake ($N_2$) - ALD reactor | 0.62 | 0.03 |
| Example 6a | 8.73 | 0.05 |
| Example 6b | 7.80 | 0.03 |

The first line of the above table corresponds to SIMS analysis performed on a substrate measured before $O_3$ exposure and before transfer into the ALD reactor. The second line of the above table corresponds to SIMS analysis performed on a substrate cooled down to 350° C. in a $H_2$ atmosphere, measured before $O_3$ exposure and after transfer into the ALD reactor. The third line of the above table corresponds to SIMS analysis performed on a substrate cooled down to 350° C. in a $N_2$ atmosphere, measured before $O_3$ exposure and after transfer into the ALD reactor. The fourth line of the above table corresponds to SIMS analysis performed on the sample of example 6a. The fifth line of the above table corresponds to SIMS analysis performed on the sample of example 6b.

These SIMS results show that an exposure of 500 ms to $O_3$ as indicated in example 1, leads to a monolayer of oxygen for sample 6a (8.73 O atoms/$nm^2$ corresponds to 1.29 times the theoretical coverage of an ideal monolayer) and sample 6b (7.80 O atoms/$nm^2$ corresponds to 1.15 times the theoretical coverage of an ideal monolayer). One monolayer of oxygen on Si(100) theoretically corresponds to $6.78*10^{14}$ at/$cm^2$.

It also shows that transporting the substrate through the cluster results in levels of oxygen that are much lower than a monolayer.

Figure 11:
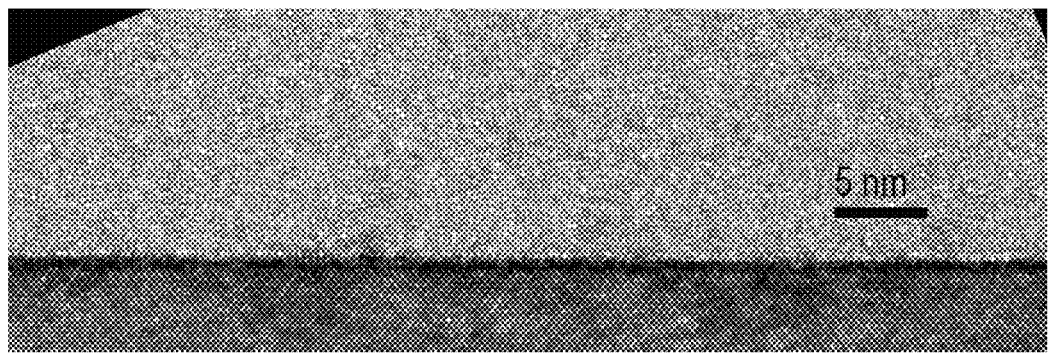
FIG. 11 is a Transmission Electron Microscopy image of a semi-conductor substrate according to an embodiment of the present disclosure.
Figure 12:
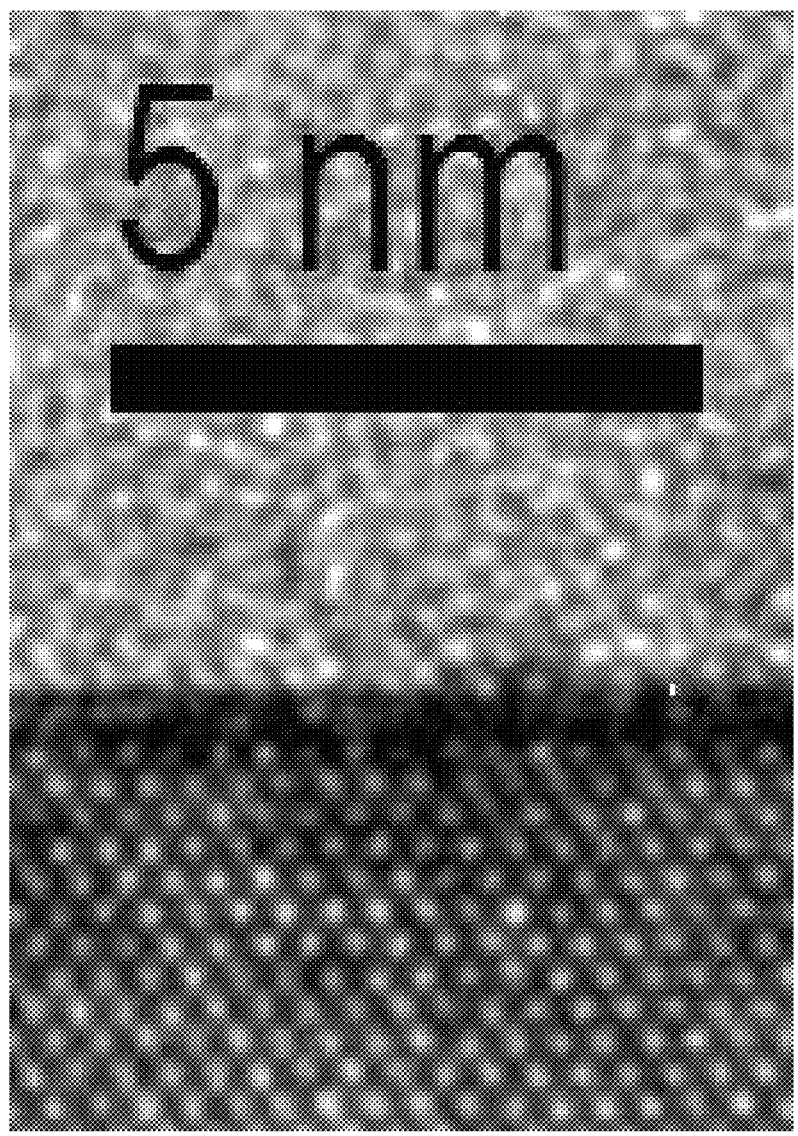
FIG. 12 is an enlarged portion of FIG. 11.

FIG. 11 shows a TEM picture of the substrate obtained in example 6a. The TEM picture was taken in a Tecnai F30 operating at 300 kV after a 150 nm CVD $SiO_2$ layer was deposited onto the Si cap layer. Use was made of a Focussed Ion Beam lift-out. It can be clearly seen in the enlarged picture of FIG. 12 that the Si layer overlaying the oxygen monolayer is amorphous.

Figure 13:
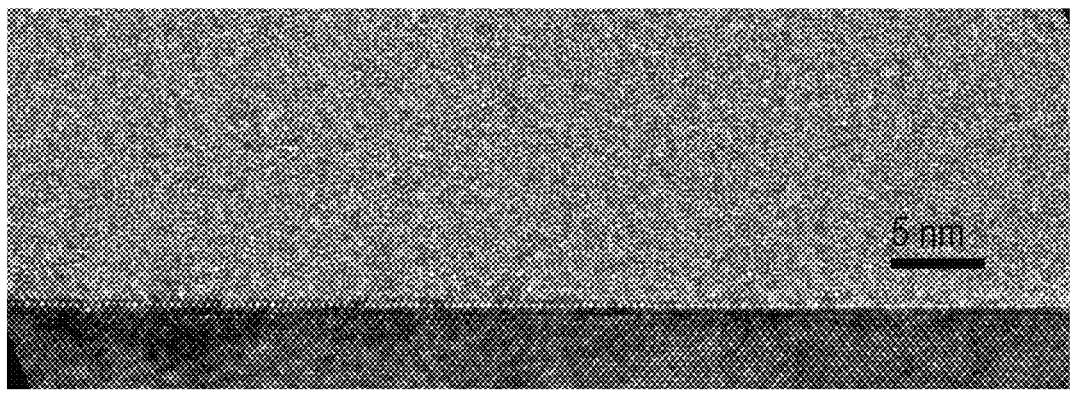
FIG. 13 is a Transmission Electron Microscopy image of a semi-conductor substrate according to an embodiment of the present disclosure.
Figure 14:
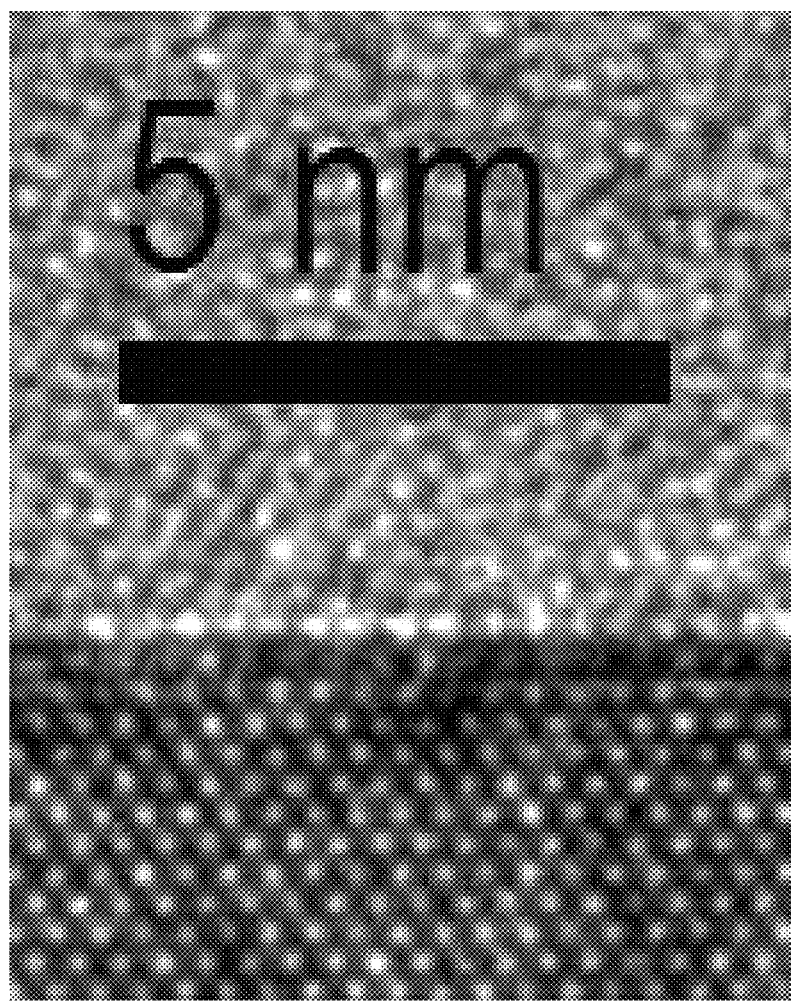
FIG. 14 is an enlarged portion of FIG. 13.

FIG. 13 shows a TEM picture of the substrate obtained in example 6b. It can also be clearly seen in the enlarged picture of FIG. 14 that the Si layer overlaying the oxygen monolayer is amorphous.

The complete absence of epitaxial regions in FIGS. 11 to 14 indicates that the oxygen monolayer is continuous and complete.

Example 8

Epitaxial Si-Capped Oxygen Monolayer

In this example, example 6 has been repeated except that the Si deposition rate was decreased by first decreasing the $SiH_4$ flow in the Si CVD process to 10 sccm for 10 minutes before increasing the $SiH_4$ flow back to 75 sccm for 180 minutes, and that the oxygen deposition was tuned towards lower oxygen coverage by using a 50 ms exposure to 200 sccm of a 100 g/$m^3$ $O_3$ gas.

Figure 18:
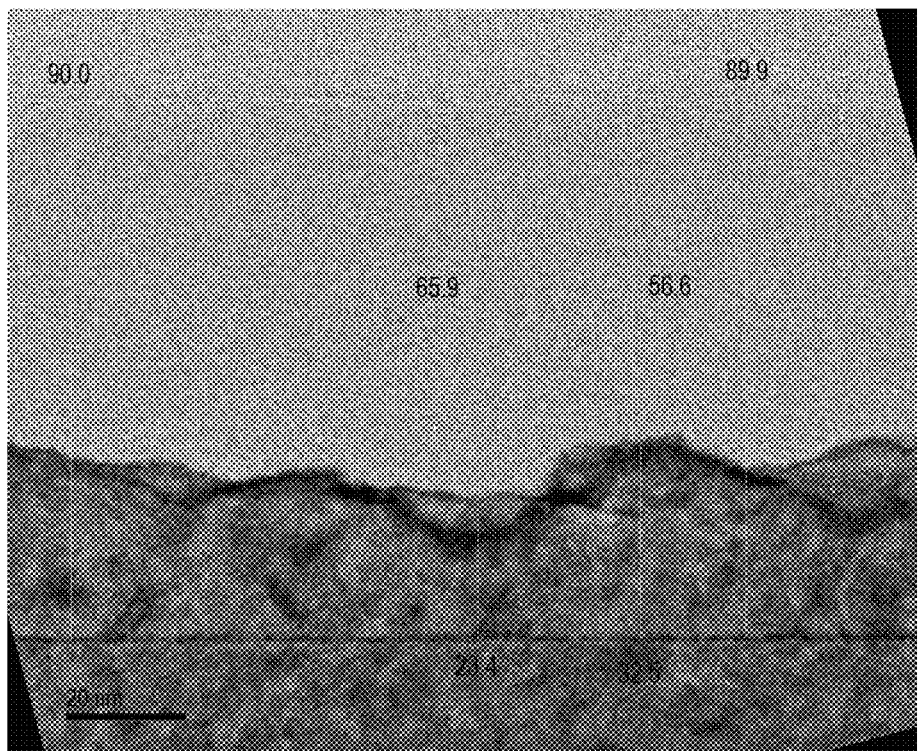
FIG. 18 is a TEM micrograph showing an epitaxial silicon layer grown on an oxygen monolayer according to an embodiment of the present disclosure.
Figure 19:
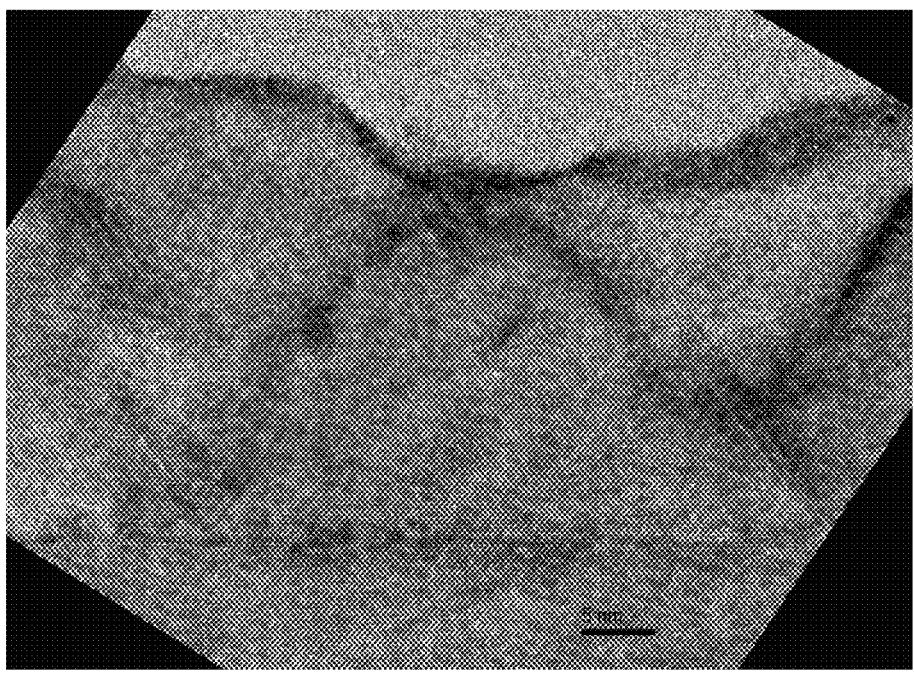
FIG. 19 is an enlarged portion of FIG. 18.

The oxygen content thereby obtained was slightly lower than in example 6 (0.92 monolayer instead of about 1.2 monolayer). The TEM pictures were taken in a Tecnai F30 operating at 300 kV after a 150 nm CVD $SiO_2$ layer was deposited onto the Si cap layer. FIG. 18 is a TEM picture showing a Si layer clearly separated into two Si regions: a darker crystalline epitaxial Si region at the bottom of the picture and a brighter amorphous region at the top of the picture. This is even clearer in the enlarged portion of FIG. 18 shown in FIG. 19. The total thickness of the deposited Si is from 88.5 to 90.9 nm, which is a bit thicker than the expected 80 nm. The epitaxial Si region is rough and varies in thickness in the range of 23.4 to 43.4 nm. The amorphous Si on top thereof is therefore from 45.7 to 65.9 nm thick.

The epitaxial Si represents on average less than 50% of the deposited Si. In both Figures, the interface between the epitaxial Si and the Si substrate is seen as a dark line. This dark line likely originates from stress at the interface caused by the oxygen monolayer. This interface can be correlated to the presence of the fractional monolayer of oxygen. It is therefore clear from these figures that a Si epitaxial layer could be grown onto the oxygen monolayer. It could also be observed that the amorphous Si present on top of the epitaxial Si appears at some locations to be actually polycrystalline with grains measuring a few nanometers. The ratio between amorphous/polycrystalline structures could, however, not been determined Some {III} defects (nanotwins, stacking faults) could also be observed throughout the epitaxial Si.

Example 9

Fabrication of Two-Dimensional Superlattices

Example 9a

First Procedure

A Si substrate comprising a fractional oxygen monolayer on a surface thereof and an epitaxial Si layer overlaying the oxygen monolayer is prepared as indicated in example 8. In this procedure, the $SiH_4$ flow in the Si CVD process is first set to 10 sccm for 10 minutes and directly after it is increased to 75 sccm for 180 minutes. The cycle oxygen monolayer deposition/$SiH_4$ (10 sccm)/$SiH_4$ (75 ccm) is repeated four more times for a total of five cycles, thereby producing a superlattice.

Example 9b

Second Procedure

A Si substrate comprising a fractional oxygen monolayer on a surface thereof and an epitaxial Si layer overlaying the oxygen monolayer is prepared as indicated in example 9a except that in the present procedure, the $SiH_4$ flow in the Si CVD process is first set to 10 sccm for 10 minutes, then a delay of 10 minutes is observed, and after this delay, it is increased to 75 sccm for 180 minutes. The cycle oxygen monolayer deposition/$SiH_4$ (10 sccm)/delay/$SiH_4$ (75 ccm) is repeated four more times for a total of five cycles, thereby producing a superlattice.

Example 9c

Third Procedure

A Si substrate comprising a fractional oxygen monolayer on a surface thereof and an epitaxial Si layer overlaying the oxygen monolayer is prepared as indicated in example 9a except that in the present procedure, the $SiH_4$ flow in the Si CVD process is first set to 10 sccm for 10 minutes, then an annealing at 550° C. is performed for 5 minutes, and after this annealing, the $SiH_4$ flow is increased to 75 sccm for 180 minutes. The cycle oxygen monolayer deposition/$SiH_4$ (10 sccm)/annealing/$SiH_4$ (75 ccm) is repeated four more times for a total of five cycles, thereby producing a superlattice.

Example 9d

Fourth Procedure

A Si substrate comprising a fractional oxygen monolayer on a surface thereof and an epitaxial Si layer overlaying the oxygen monolayer is prepared as indicated in example 9a except that in the present procedure, the $SiH_4$ flow in the Si CVD process is first set to 10 sccm for 10 minutes, then an annealing at 650° C. is performed for 5 minutes, and after this annealing, the $SiH_4$ flow is increased to 75 sccm for 180 minutes. The cycle oxygen monolayer deposition/$SiH_4$ (10 sccm)/annealing/$SiH_4$ (75 ccm) is repeated four more times for a total of five cycles, thereby producing a superlattice.

Example 9e

Fifth Procedure

A Si substrate comprising a fractional oxygen monolayer on a surface thereof and an epitaxial Si layer overlaying the oxygen monolayer is prepared as indicated in example 9a except that in the present procedure, the $SiH_4$ flow in the Si CVD process is first set to 10 sccm for 60 minutes instead of 10 minutes, then it is increased to 75 sccm for 180 minutes. The cycle oxygen monolayer deposition/$SiH_4$ (10 sccm)/delay/SiH4 (75 ccm) is repeated four more times for a total of five cycles, thereby producing a superlattice.

Example 9f

Sixth Procedure

Any one of examples 9a to 9e can be repeated on a Si or Ge substrate comprising a complete oxygen monolayer on a surface thereof as prepared in examples 1 and 5, respectively. An epitaxial Si layer overlaying the complete oxygen monolayer can thereby be prepared and the repetition of the cycle oxygen monolayer deposition Si precursor produces a superlattice.

Example 10

Deposition of a High-K Dielectric Layer on an Oxygen Monolayer

Figure 20:
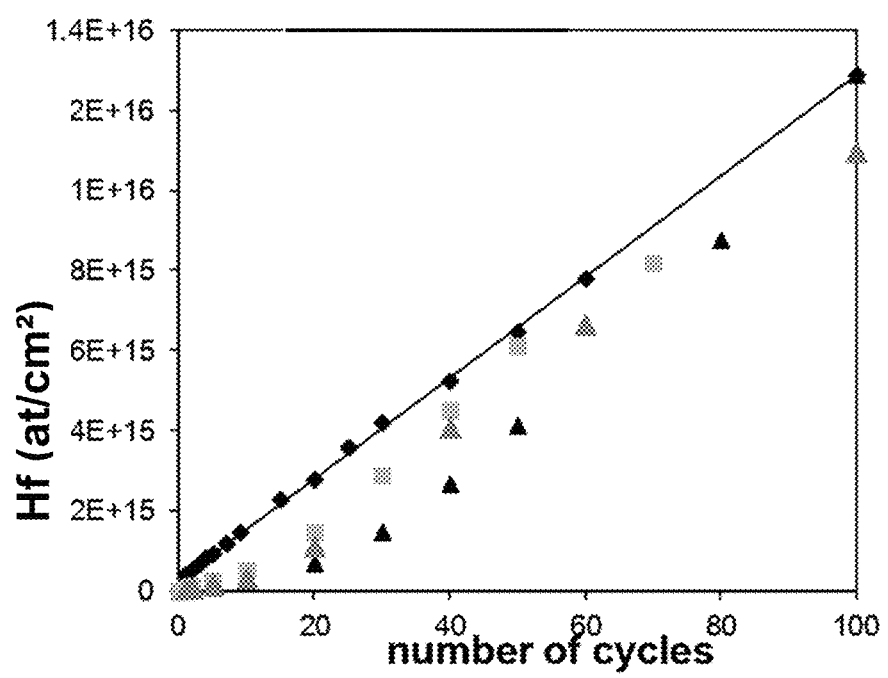
FIG. 20 is a graph showing the Hf coverage as a function of the number of cycles for processes of the prior art and a process according to an embodiment of the present disclosure.

We now refer to FIG. 1. The substrate (1, 2) obtained in example 1 has been reacted in an ALD process with alternating $HfCl_4$ and $H_2O$ pulses at 300° C. in an ALD reactor. The use of $H_2O$ as an oxidant in the ALD $HfO_2$ layer 3 deposition cycle helps to keep the thickness of the oxygen monolayer 2 unchanged by preventing further oxidation of the Si substrate. Layer closure was observed around 40 cycles (about 2 nm). This is demonstrated in FIG. 20 wherein the growth curves as determined by RBS show the Hf content (at/cm$^2$) as a function of the number of cycles for methods of the prior art (diamonds, 1 nm chemically oxidized Si as obtained in Meuris et al.; squares, 0.4 nm thick chemically oxidized Si; and dark triangles, HF treated Si) and for the method of example 10 (light triangles). It can be seen from these growth curves that the curves are similar for example 10 and for the 0.4 nm thick chemically oxidized Si.

It is to be understood that although preferred embodiments, specific constructions and configurations, as well as materials, have been discussed herein for devices according to the present disclosure, various changes or modifications in form and detail may be made without departing from the scope and spirit of this disclosure. For example, any formulas and values given above are merely representative of procedures and approximate values that may be used. Functionality may be added or deleted from the block diagrams and operations may be interchanged among functional blocks. Steps may be added or deleted to methods described within the scope of the present disclosure.

The invention claimed is:

1. A Si or Ge semi-conductor substrate comprising:
   a complete oxygen monolayer on a surface of the Si or Ge substrate, wherein a $Si^{4+}$ or $Ge^{4+}$ oxidation state of the surface of the Si or Ge substrate, respectively, resulting from the presence of the oxygen monolayer represents less than 50% of the sum of $Si^{1'}$, $Si^{3+}$ and $Si^{4+}$ oxidation states or the sum of $Ge^{1+}$ $Ge^{2+}$, $Ge^{3+}$, and $Ge^{4+}$ oxidation states, respectively, as measured by XPS.

2. The semi-conductor substrate according to claim 1, wherein the $Si^{4+}$ or $Ge^{4+}$ oxidation state of the surface of the Si or Ge substrate, respectively, resulting from the presence of the oxygen monolayer represents less than 30% of the sum of $Si^{1+}$, $Si^{2+}$, $Si^{3+}$ and $Si^{1+}$ oxidation states or the sum of $Ge^{1+}$, $Ge^{2+}$, $Ge^{3+}$, and $Ge^{4+}$ oxidation states, respectively.

3. The semi-conductor substrate according to claim 1, wherein the most frequent oxidation state of the Si or Ge at the surface of the substrate resulting from the presence of the oxygen monolayer is $Si^{1+}$ or $Ge^{1+}$ respectively, as measured by XPS.

4. The semi-conductor substrate according to claim 1, wherein the oxygen monolayer has a thickness of from between about 0.17 to 0.51 nm as measured by ellipsometry.

5. The semi-conductor substrate according to claim 4, wherein the oxygen monolayer has a thickness of from between about 0.30 to 0.38 nm as measured by ellipsometry.

6. The semi-conductor substrate according to claim 1, wherein the oxygen monolayer has from between about $4*10^{14}$ atoms/cm$^2$ to $10*10^{14}$ atoms/cm$^2$, as measured by Si encapsulated SIMS.

7. The semi-conductor substrate according to claim 6, wherein the oxygen monolayer has from between about $5*10^{14}$ atoms/cm$^2$ to $9*10^{14}$ atoms/cm$^2$, as measured by Si encapsulated SIMS.

8. The semi-conductor substrate of claim 1, further comprising an overlying layer of a semi-conductor material in contact with the monolayer.

9. The semi-conductor substrate according to claim 8, wherein the overlying layer is an epitaxial semi-conductor layer, and the semi-conductor material is a high-k dielectric material.

10. The semi-conductor substrate according to claim 8, wherein at least a second bilayer overlays the overlying layer, the second bilayer consisting of a second oxygen monolayer overlaid by a second overlying layer of a semi-conductor material in contact with the second monolayer.

11. A device comprising the semi-conductor substrate of claim 1.

12. A method of manufacturing a semi-conductor device comprising the steps of:
providing a Si or Ge semi-conductor substrate substantially free of oxygen contamination and at a temperature of from between about 30° C. to 90° C.; and
reacting the semi-conductor substrate with $O_3$ in the gaseous phase at a concentration of from between 50 to 400 g/m$^3$, at a partial pressure of from between 0.005 to 0.12 Torr, at a flow rate of from between 100 sccm to 800 sccm, for a duration of from between 0.02 to 1.5 s, thereby providing an oxygen monolayer on a surface thereof,
wherein the oxygen monolayer is complete, and wherein a $Si^{4+}$ or $Ge^{4+}$ oxidation state of the surface of the Si or Ge substrate, respectively, resulting from the presence of the oxygen monolayer represents less than 50% of the sum of $Si^{1+}$, $Si^{2+}$, $Si^{3+}$, and $Si^{4+}$ oxidation states or the sum of $Ge^{1+}$, $Ge^{2+}$, $Ge^{3+}$, and $Ge^{4+}$ oxidation states, respectively, as measured by XPS.

13. The method of claim 12, further comprising providing a semi-conducting layer directly on top of the monolayer.

14. The method of claim 13, wherein the semi-conducting layer is deposited by atomic layer deposition.

15. The method of claim 13, wherein the semi-conducting layer is a high-k dielectric layer.

16. The method of claim 15, wherein the high-k dielectric layer is a metal oxide layer deposited by an atomic layer deposition process alternating pulses of a precursor to the metal with pulses of water.

17. The method of claim 13, wherein the step of providing a semi-conducting layer directly on top of the monolayer comprises reacting the oxygen monolayer with a precursor to the semi-conductor via Low Pressure Chemical Vapor Deposition, thereby providing an epitaxial semiconductor layer thereon.

18. The method of claim 13, wherein the steps of reacting the semi-conductor substrate with $O_3$ and providing a semi-conducting layer directly on top of the monolayer are repeated at least once after the performance of the step of providing a semi-conducting layer directly on top of the monolayer.

* * * * *